(12) United States Patent
Ono et al.

(10) Patent No.: US 12,154,966 B2
(45) Date of Patent: Nov. 26, 2024

(54) SEMICONDUCTOR DEVICE THAT INCLUDES A CONDUCTIVE MEMBER AND AN ELECTRODE AND METHOD FOR MANUFACTURING THE SAME

(71) Applicant: KABUSHIKI KAISHA TOSHIBA, Tokyo (JP)

(72) Inventors: Hiroshi Ono, Setagaya (JP); Yosuke Kajiwara, Yokohama (JP); Masahiko Kuraguchi, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 244 days.

(21) Appl. No.: 17/454,306

(22) Filed: Nov. 10, 2021

(65) Prior Publication Data
US 2022/0336630 A1   Oct. 20, 2022

(30) Foreign Application Priority Data

Apr. 15, 2021 (JP) ................................ 2021-068885

(51) Int. Cl.
*H01L 29/778* (2006.01)
*H01L 29/20* (2006.01)
(Continued)

(52) U.S. Cl.
CPC .... *H01L 29/66431* (2013.01); *H01L 29/2003* (2013.01); *H01L 29/432* (2013.01); *H01L 29/778* (2013.01)

(58) Field of Classification Search
CPC ..... H01L 29/402–407; H01L 29/66431; H01L 29/66462; H01L 29/778–7789; H01L 29/7813
See application file for complete search history.

(56) References Cited

U.S. PATENT DOCUMENTS

| | | | |
|---|---|---|---|
| 4,503,449 A | 3/1985 | David et al. | |
| 6,339,257 B1 * | 1/2002 | Fujiki | H01L 24/05 257/781 |

(Continued)

FOREIGN PATENT DOCUMENTS

| | | | |
|---|---|---|---|
| JP | 64-021968 A | 1/1989 | |
| JP | 05-008586 B2 | 2/1993 | |

(Continued)

*Primary Examiner* — Eric A. Ward
(74) *Attorney, Agent, or Firm* — Oblon, McClelland, Maier & Neustadt, L.L.P.

(57) ABSTRACT

According to one embodiment, a semiconductor device includes a semiconductor member, a first conductive member, a first electrode, a first insulating member, and a second insulating member. The semiconductor member includes a first partial region, a second partial region, and a third partial region. The first partial region is between the second partial region the third partial region. The first conductive member includes a first conductive portion. The first conductive portion is between the second partial region and the third partial region. The first electrode is electrically connected to the first conductive member. The first electrode includes a first electrode portion, a second electrode portion, and a third electrode portion. The first insulating member includes a first insulating region, a second insulating region, and a third insulating region. The second insulating member includes a first insulating portion and a second insulating portion.

18 Claims, 4 Drawing Sheets

(51) Int. Cl.
*H01L 29/43* (2006.01)
*H01L 29/66* (2006.01)

(56) References Cited

U.S. PATENT DOCUMENTS

| | | | | |
|---|---|---|---|---|
| 6,590,295 | B1* | 7/2003 | Liao | H01L 24/13 |
| | | | | 257/781 |
| 6,734,036 | B2* | 5/2004 | Chakrabarti | H01L 31/022408 |
| | | | | 257/458 |
| 7,989,955 | B2* | 8/2011 | Yagi | H01L 21/76804 |
| | | | | 257/750 |
| 2011/0049526 | A1* | 3/2011 | Chu | H01L 29/66462 |
| | | | | 257/E29.089 |
| 2012/0220089 | A1 | 8/2012 | Imada et al. | |
| 2015/0270355 | A1 | 9/2015 | Kuraguchi et al. | |
| 2019/0207019 | A1* | 7/2019 | Tsai | H01L 29/42316 |
| 2020/0006579 | A1* | 1/2020 | Quddus | H01L 29/0623 |
| 2020/0168502 | A1* | 5/2020 | Tsai | H01L 21/31116 |
| 2020/0373422 | A1 | 11/2020 | Kuraguchi et al. | |

FOREIGN PATENT DOCUMENTS

| | | | |
|---|---|---|---|
| JP | 2013-138137 | A | 7/2013 |
| JP | 2015-179786 | A | 10/2015 |
| JP | 5866773 | B2 | 2/2016 |
| JP | 2020-191378 | A | 11/2020 |

\* cited by examiner

FIG. 5C

SEMICONDUCTOR DEVICE THAT INCLUDES A CONDUCTIVE MEMBER AND AN ELECTRODE AND METHOD FOR MANUFACTURING THE SAME

CROSS-REFERENCE TO RELATED APPLICATIONS

This application is based upon and claims the benefit of priority from Japanese Patent Application No. 2021-068885, filed on Apr. 15, 2021; the entire contents of which are incorporated herein by reference.

FIELD

Embodiments described herein relate generally to a semiconductor device and a method for manufacturing the same.

BACKGROUND

For example, there are semiconductor devices such as transistors using nitride semiconductors. Stable characteristics are desired in semiconductor devices.

DETAILED DESCRIPTION

According to one embodiment, a semiconductor device includes a semiconductor member, a first conductive member, a first electrode, a first insulating member, and a second insulating member. The semiconductor member includes a first partial region, a second partial region, and a third partial region. A position of the first partial region in a first direction from the second partial region toward the third partial region is between a position of the second partial region in the first direction and a position of the third partial region in the first direction. The first conductive member includes a first conductive portion. The first conductive portion is between the second partial region and the third partial region in the first direction. A direction from the first partial region toward the first conductive portion is along a second direction crossing the first direction. The first electrode is electrically connected to the first conductive member. The first electrode includes a first electrode portion, a second electrode portion, and a third electrode portion. The first electrode portion is between the first partial region and the first conductive portion in the second direction. The second electrode portion is between the second partial region and the first conductive portion in the first direction. The third electrode portion is between the first conductive portion and the third partial region in the first direction. The first insulating member includes a first insulating region, a second insulating region, and a third insulating region. The first insulating region is between the first partial region and the first electrode portion in the second direction. The second insulating region is between the second partial region and the second electrode portion in the first direction. The third insulating region is between the third electrode portion and the third partial region in the first direction. The second insulating member includes a first insulating portion and a second insulating portion. The first insulating portion is between the second electrode portion and the first conductive portion in the first direction. The second insulating portion is between the first conductive portion and the third electrode portion in the first direction.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1:
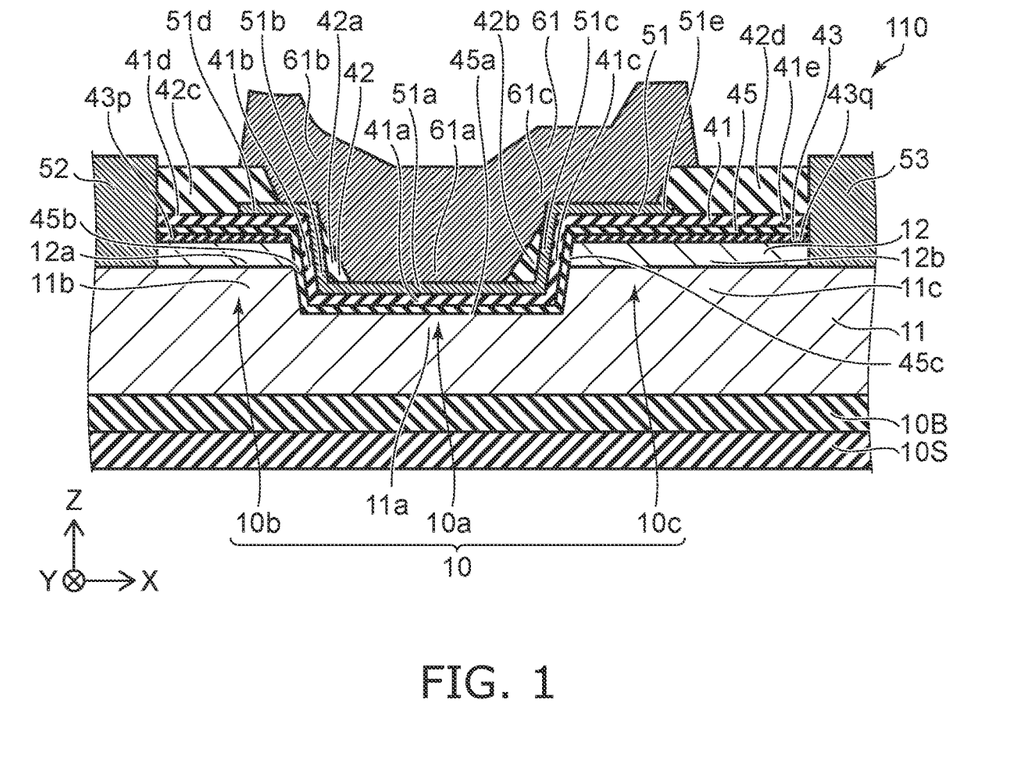
FIG. 1 is a schematic cross-sectional view illustrating a semiconductor device according to a first embodiment.

FIG. 1 is a schematic cross-sectional view illustrating a semiconductor device according to a first embodiment.

As shown in FIG. 1, a semiconductor device 110 according to the embodiment includes a semiconductor member 10, a first conductive member 61, a first electrode 5, a first insulating member 41, and a second insulating member 42.

The semiconductor member 10 includes a first partial region 10a, a second partial region 10b, and a third partial region 10c. The direction from the second partial region 10b toward the third partial region 10c is taken as a first direction. The position of the first partial region 10a in the first direction is between the position of the second partial region 10b in the first direction and the position of the third partial region 10c in the first direction.

The first direction is taken as an X-axis direction. The direction perpendicular to the X-axis direction is taken as a Z-axis direction. The direction perpendicular to the X-axis direction and the Z-axis direction is taken as a Y-axis direction.

The first conductive member 61 includes a first conductive portion 61a. The first conductive portion 61a is between the second partial region 10b and the third partial region 10c in the first direction (Z-axis direction). The direction from the first partial region 10a toward the first conductive portion 61a is along the second direction. The second direction crosses the first direction. The second direction is, for example, the Z-axis direction.

The first electrode 51 is electrically connected to the first conductive member 61. The first electrode 51 includes a first electrode portion 51a, a second electrode portion 51b, and a third electrode portion 51c. The first electrode portion 51a is between the first portion region 10a and the first conductive portion 61a in the second direction (for example, the Z-axis direction). The second electrode portion 51b is between the second portion region 10b and the first conductive portion 61a in the first direction (X-axis direction). The third electrode portion 51c is between the first conductive portion 61a and the third partial region 10c in the first direction.

The first insulating member 41 includes a first insulating region 41a, a second insulating region 41b, and a third insulating region 41c. The first insulating region 41a is between the first partial region 10a and the first electrode portion 51a in the second direction (Z-axis direction). The second insulating region 41b is between the second partial region 10b and the second electrode portion 51b in the first direction (X-axis direction). The third insulating region 41c is between the third electrode portion 51c and the third portion region 10c in the first direction.

The second insulating member 42 includes a first insulating portion 42a and a second insulating portion 42b. The first insulating portion 42a is between the second electrode portion 51b and the first conductive portion 61a in the first direction (X-axis direction). The second insulating portion 42b is between the first conductive portion 61a and the third electrode portion 51c in the first direction.

For example, the semiconductor member 10 may include a first semiconductor region 11 and a second semiconductor region 12. The first semiconductor region 11 includes, for example, $Al_{x1}Ga_{1-x1}N$ ($0 \leq x1 < 1$). The second semiconductor region 12 includes, for example, $Al_{x2}Ga_{1-x2}N$ ($0 < x2 \leq 1$). The composition ratio x1 is, for example, not less than 0 and less than 0.15. The composition ratio x2 is, for example, not less than 0.15 and not more than 0.5. The first semiconductor region 11 is, for example, GaN. The second semiconductor region 12 is AlGaN.

The first semiconductor region 11 includes a first portion 11a, a second portion 11b, and a third portion 11c. The second semiconductor region 12 includes a first semiconductor portion 12a and a second semiconductor portion 12b. The first portion 11a is included in the first portion region 10a described above. The direction from the second portion 11b toward the first semiconductor portion 12a is along the second direction (for example, the Z-axis direction). The direction from the third portion 11c toward the second semiconductor portion 12b is along the second direction. The second portion 11b and the first semiconductor portion 12a are included in the second portion region 10b described above. The third portion 11c and the second semiconductor portion 12b are included in the third portion region 10c described above.

The semiconductor device 110 may include, for example, a substrate body 10S and a nitride layer 10B. The nitride layer 10B is provided between the substrate body 10S and the semiconductor member 10. The substrate body 10S is, for example, a substrate (for example, a silicon substrate). The nitride layer 10B is, for example, a buffer layer. The nitride layer 10B includes, for example, a nitride semiconductor.

The nitride layer 10B is provided on the substrate body 10S. The semiconductor member 10 is provided on the nitride layer 10B. The second semiconductor region 12 is provided on a portion of the first semiconductor region 11.

The semiconductor device 110 may further include a second electrode 52 and a third electrode 53. The position of the first electrode 51 in the first direction (X-axis direction) is between the position of the second electrode 52 in the first direction and the position of the third electrode 53 in the first direction. The first semiconductor portion 12a is between at least a portion of the second electrode 52 and the second insulating region 41b in the first direction. The second semiconductor portion 12b is between the third insulating region 41c and at least a portion of the third electrode 53 in the first direction. The second electrode 52 is electrically connected to, for example, the second portion 11b. The third electrode 53 is electrically connected to the third portion 11c.

A current flowing between the second electrode 52 and the third electrode 53 can be controlled by, for example, a potential of the first electrode 51. The potential of the first electrode 51 is, for example, a potential based on the potential of the second electrode 52. The first electrode 51 functions as, for example, a gate electrode. The second electrode 52 functions as, for example, a source electrode. The third electrode 53 functions as, for example, a drain electrode. The semiconductor device 110 is, for example, a transistor.

A carrier region is formed in the vicinity of the interface between the first semiconductor region 11 and the second semiconductor region 12. The carrier region is, for example, a two-dimensional electron gas. The semiconductor device 110 is, for example, HEMT (High Electron Mobility Transistor).

In the embodiment, for example, at least a portion of the first electrode 51 is between the semiconductor members 10 in the second direction (in the X-axis direction). The first electrode 51 is a recess type gate electrode. As a result, a higher threshold voltage can be obtained. For example, normal off characteristics can be obtained.

The first conductive member 61 is an interconnect electrode connected to the first electrode 51. In the embodiment, as described above, the second insulating member 42 including the first insulating portion 42a and the second insulating portion 42b is provided. The first insulating portion 42a is provided between the second electrode portion 51b and the first conductive portion 61a in the first direction (X-axis direction). The second insulating portion 42b is provided between the first conductive portion 61a and the third electrode portion 51c in the first direction. The first insulating portion 42a and the second insulating portion 42b are provided at positions corresponding to the corner portions of the recess type gate electrode.

Thereby, for example, the characteristics of the first conductive member 61 are further stabilized.

In the following, one example of the shape of the second insulating member 42 will be described.

Figure 2:
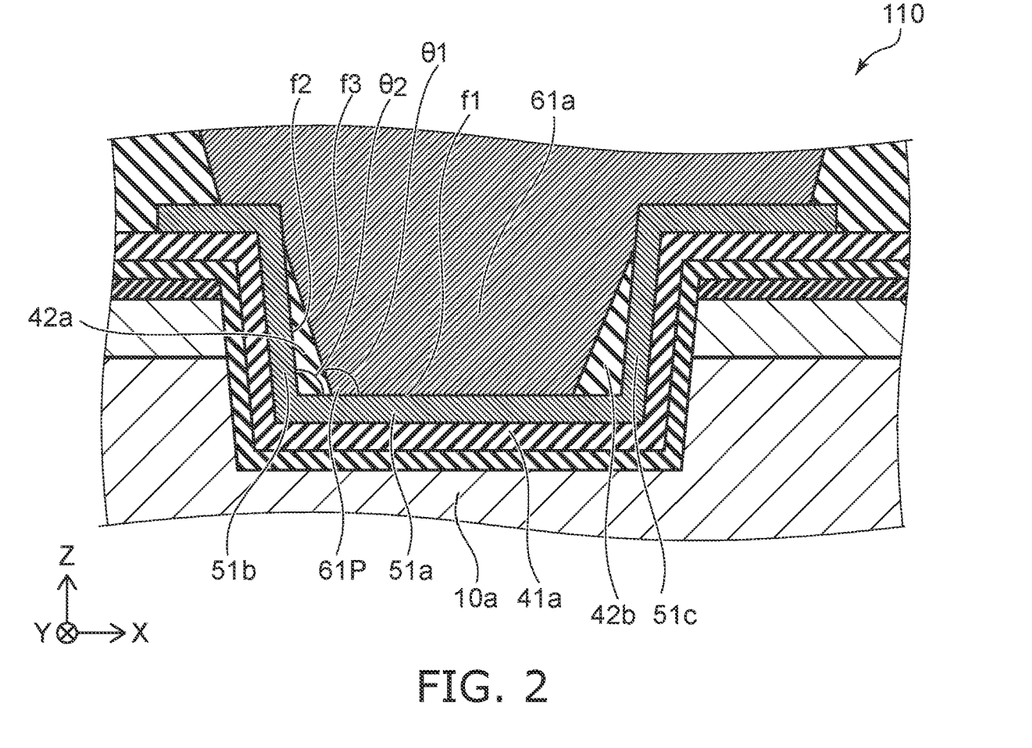
FIG. 2 is a schematic cross-sectional view illustrating a portion of the semiconductor device according to the first embodiment.

FIG. 2 is a schematic cross-sectional view illustrating a portion of the semiconductor device according to the first embodiment.

As shown in FIG. 2, the first electrode portion 51a includes a first surface f1 and a second surface f2. The first surface f1 faces the first conductive portion 61a in the second direction (Z-axis direction). The second surface f2 faces the first insulating portion 42a in the first direction (X-axis direction). The first insulating portion 42a includes a third surface f3 facing the first conductive portion 61a in the first direction.

The angle between the third surface f3 and the first surface f1 is taken as a first angle θ1. The angle between the second surface f2 and the first surface f1 is taken as a second angle θ2. The first angle θ1 is larger than the second angle θ2. The first angle θ1 and the second angle θ2 are not less than 90 degrees. For example, the inclination of the third surface f3 is gentler than the inclination of the second surface f2.

The first conductive member 61 is provided on the first insulating portion 42a (second insulating member 42). As a result, for example, the characteristics of the first conductive member 61 become more stable.

For example, there is a first reference example in which the second insulating member 42 is not provided. In the first reference example, the conductive portion formed on the first electrode portion 51a (bottom portion) tends to be discontinuous with the conductive portion formed on the second electrode portion 51b (side portion). As a result, the characteristics of the first conductive member 61 tend to be more stable.

On the other hand, in the embodiment, by providing the first insulating portion 42a and the second insulating portion 42b, the conductive member provided on them is smoothly formed. It is easy to obtain a more uniform first conductive member 61. According to the embodiment, it is possible to provide a semiconductor device capable of obtaining stable characteristics.

By providing the first insulating portion 42a and the second insulating portion 42b, the characteristics of the corner portion of the first electrode 51 can be easily stabilized. For example, in the above first reference example, the first electrode 51 and the first conductive member 61 are also in contact with each other at the corner portion of the recess type gate electrode. As a result, in the corner portion, the material and configuration of the first electrode 51 are likely to change due to the influence of the first conductive member 61. For example, some of the elements included in the first electrode 51 can easily move to the first conductive member 61. For example, the elements included in the first conductive member 61 can easily move to the first electrode 51. As a result, the characteristics of the first electrode 51 (for example, the work function) are likely to fluctuate. When the characteristics of the first electrode 51 change, the threshold voltage changes.

The threshold voltage is particularly sensitive to changes in the characteristics of the corner portion of the first electrode 51 (recess type gate electrode). Therefore, in the first reference example, the change in the threshold voltage due to the characteristics of the corner portion is large.

On the other hand, in the embodiment, the characteristics of the corner portion of the first electrode 51 (recess type gate electrode) are unlikely to change. As a result, a more stable threshold voltage can be obtained. According to the embodiment, it is possible to provide a semiconductor device capable of obtaining stable characteristics.

In the embodiment, by providing the first insulating portion 42a and the second insulating portion 42b, it is easy to suppress the strain generated in the first conductive member 61. As a result, more stable characteristics can be obtained. According to the embodiment, it is possible to provide a semiconductor device capable of obtaining stable characteristics.

As shown in FIG. 1, the first conductive member 61 may further include a second conductive portion 61b and a third conductive portion 61c. The first insulating portion 42a is between a part of the first electrode portion 51a and at least a part of the second conductive portion 61b in the second direction (for example, the Z-axis direction). The second insulating portion 42b is between an other portion of the first electrode portion 51a and at least a portion of the third conductive portion 61c in the second direction.

As shown in FIG. 1, in this example, the second electrode portion 51b is between the first portion region 10a and the second conductive portion 61b in the second direction (Z-axis direction). The third electrode portion 51c is between the first portion region 10a and the third conductive portion 61c in the second direction.

For example, the second electrode portion 51b is electrically connected to the second conductive portion 61b. The third electrode portion 51c is electrically connected to the third conductive portion 61c. For example, the second electrode portion 51b is in contact with the second conductive portion 61b. The third electrode portion 51c is in contact with the third conductive portion 61c. For example, the first electrode portion 51a may be in contact with the first conductive portion 61a.

As shown in FIG. 1, the second insulating member 42 may further include a third insulating portion 42c and a fourth insulating portion 42d. The first semiconductor portion 12a is between the second portion 11b and the third insulating portion 42c in the second direction (for example, the Z-axis direction). The second semiconductor portion 12b is between the third portion 11c and the fourth insulating portion 42d in the second direction.

As shown in FIG. 1, the first electrode 51 may further include a fourth electrode portion 51d and a fifth electrode portion 51e. At least a part of the fourth electrode portion 51d is between the first semiconductor portion 12a and the third insulating portion 42c in the second direction (Z-axis direction). At least a part of the fifth electrode portion 51e is between the second semiconductor portion 12b and the fourth insulating portion 42d in the second direction.

As shown in FIG. 1, the semiconductor device 110 may further include a third insulating member 43. A portion 43p of the third insulating member 43 is between the first semiconductor portion 12a and the fourth electrode portion 51d in the second direction (for example, the Z-axis direction). An other portion 43q of the third insulating member 43 is between the second semiconductor portion 12b and the fifth electrode portion 51e in the second direction.

In one example, the first insulating member 41 includes silicon and oxygen. The second insulating member 42 includes silicon and oxygen. The third insulating member 43 includes silicon and nitrogen. For example, the first insulating member 41 and the second insulating member 42 do not include nitrogen. Alternatively, the concentration of nitrogen in the first insulating member 41 and the second insulating member 42 is lower than the concentration of nitrogen in the third insulating member 43.

For example, the first insulating member 41 and the second insulating member 42 include silicon oxide (for example, $SiO_2$). As a result, more stable electrical characteristics can be easily obtained. For example, the third insulating member 43 includes silicon nitride (eg SiN). By providing such a third insulating member 43, for example, the characteristics of the semiconductor member 10 can be easily stabilized.

As shown in FIG. 1, the first insulating member 41 may include a fourth insulating region 41d and a fifth insulating region 41e. For example, at least a portion of the fourth insulating region 41d is between a part 43p of the third insulating member 43 and a fourth electrode portion 51d. For example, at least a portion of the fifth insulating region 41e is between the other portion 43q of the third insulating member 43 and the fifth electrode portion 51e.

As shown in FIG. 1, the semiconductor device 110 may further include a nitride member 45. The nitride member 45 includes Al and nitrogen. The nitride member 45 includes, for example, AlN. The nitride member 45 includes, for example, a first nitride portion 45a, a second nitride portion 45b, and a third nitride portion 45c. The first nitride portion 45a is between the first partial region 10a and the first insulating region 41a. The second nitride portion 45b is between the second partial region 10b and the second insulating region 41b. The third nitride portion 45c is between the third insulating region 41c and the third partial region 10c. By providing such a nitride member 45, the characteristics of the semiconductor member 10 become more stable.

As shown in FIG. 2, the first conductive portion 61a includes a first corner portion 61P. The first corner portion 61P faces the first electrode portion 51a in the second direction (Z-axis direction) and faces the second portion region 10b in the first direction (X-axis direction). At least a part of the first insulating portion 42a is between the first corner portion 61P and the second electrode portion 51b.

Figure 3:
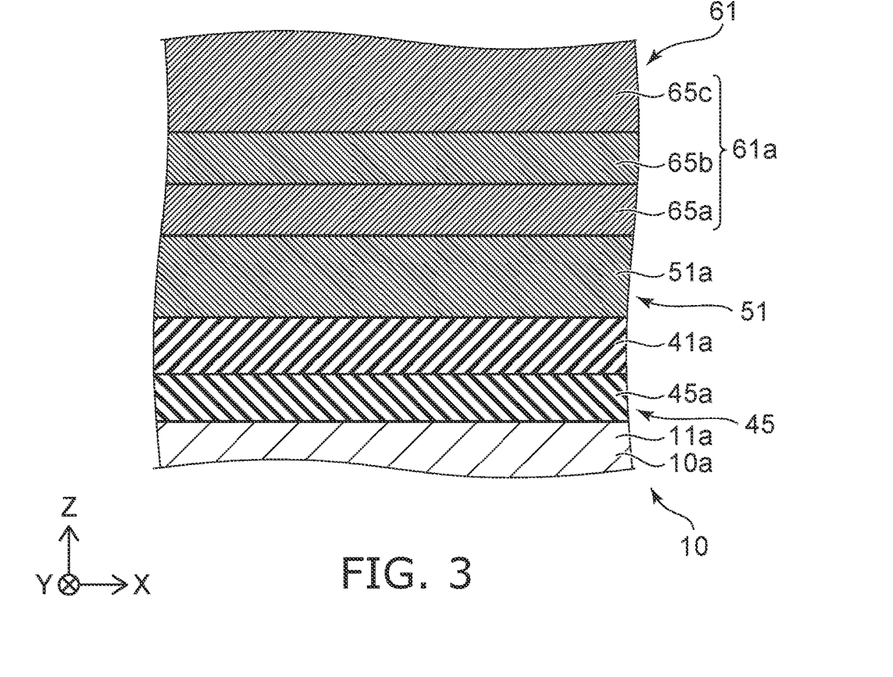
FIG. 3 is a schematic cross-sectional view illustrating a portion of the semiconductor device according to the first embodiment.

FIG. 3 is a schematic cross-sectional view illustrating a portion of the semiconductor device according to the first embodiment.

As shown in FIG. 3, the first conductive member 61 (for example, the first conductive portion 61a) may include the first film 65a and the second film 65b. The first conductive portion 61a may further include a third film 65c. The first film 65a is between the first electrode portion 51a and the second film 65b. The second film 65b is between the first film 65a and the third film 65c.

For example, the first film 65a may include a metal element included in the first electrode 51. For example, the first electrode 51 includes titanium (Ti) and nitrogen. The first electrode 51 includes, for example, TiN. The first film 65a includes, for example, Ti. The second film 65b includes Pt. The third film 65c includes at least one selected from the group consisting of, for example, Al and Au. More stable characteristics can be obtained from such a configuration.

Second Embodiment

The second embodiment relates to a method for manufacturing a semiconductor device.

FIGS. 4A to 4D and 5A to 5C are schematic cross-sectional views illustrating the method for manufacturing the semiconductor device according to the second embodiment.

Figure 4A:
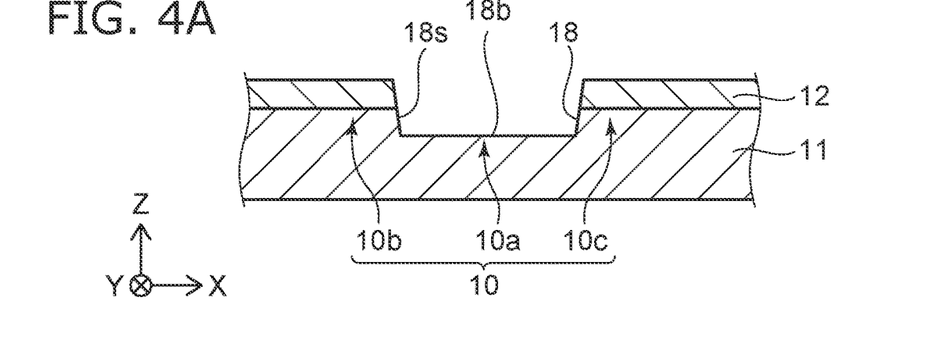
FIGS. 4A to 4D are schematic cross-sectional views illustrating a method for manufacturing a semiconductor device according to a second embodiment.

As shown in FIG. 4A, the semiconductor member 10 is prepared. The semiconductor member 10 includes a hole 18. The hole 18 includes a bottom portion 18b and a side portion 18s.

Figure 4B:
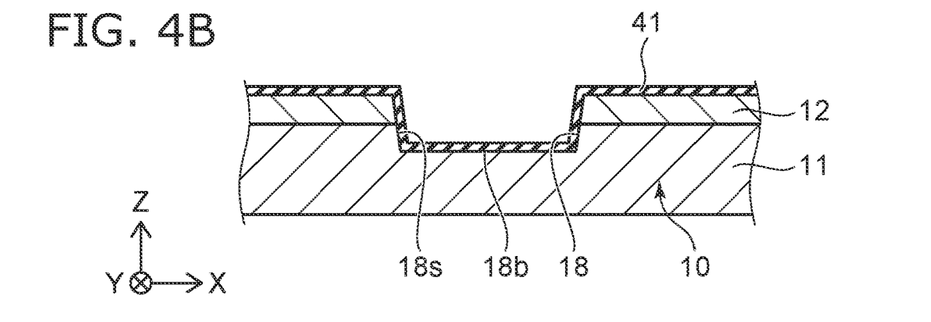

As shown in FIG. 4B, the first insulating member 41 is provided on the bottom portion 18b and the side portion 18s of the hole 18. Prior to the formation of the first insulating member 41, a film to be the third insulating member 43 (for example, SiN) may be formed and a portion of the film may be removed, if necessary. Further, before the formation of the first insulating member 41, a film to be the nitride member 45 (for example, AlN) may be formed if necessary.

Figure 4C:
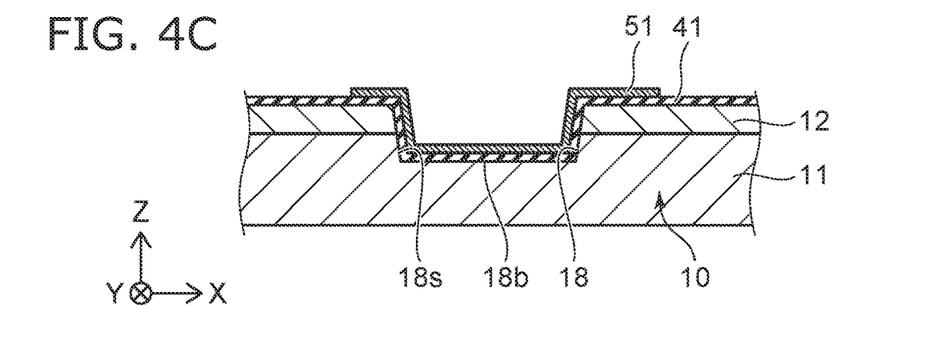

As shown in FIG. 4C, the first electrode 51 is formed on the first insulating member 41.

Figure 4D:
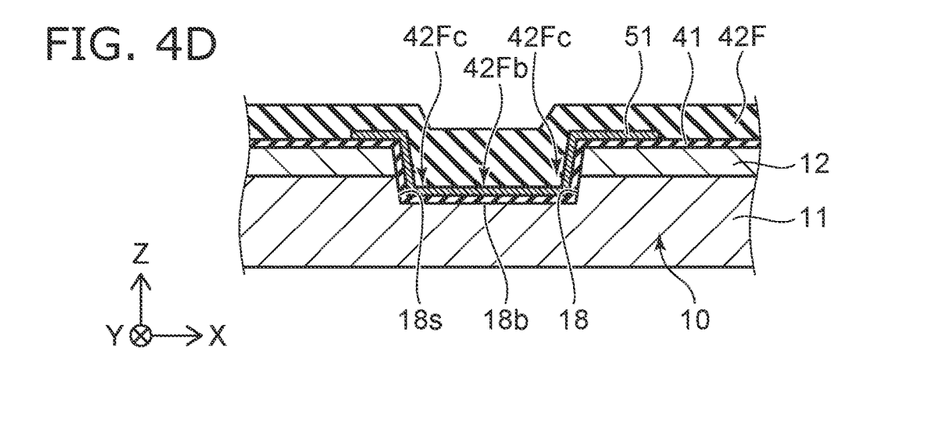

As shown in FIG. 4D, the insulating film 42F is formed on the first electrode 51 and on the semiconductor member 10. The insulating film 42F includes a bottom insulating portion 42Fb above the bottom portion 18b and a corner insulating portion 42Fc above the bottom portion 18b and the side portion 18s.

Figure 5A:
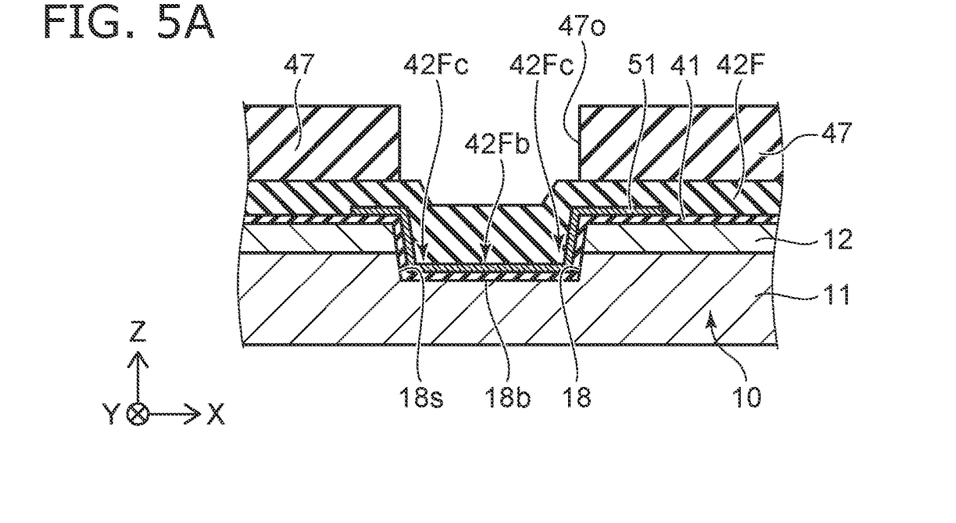
FIGS. 5A to 5C are schematic cross-sectional views illustrating the method for manufacturing the semiconductor device according to the second embodiment.

As shown in FIG. 5A, a mask material 47 having an opening 47o is formed.

Figure 5B:
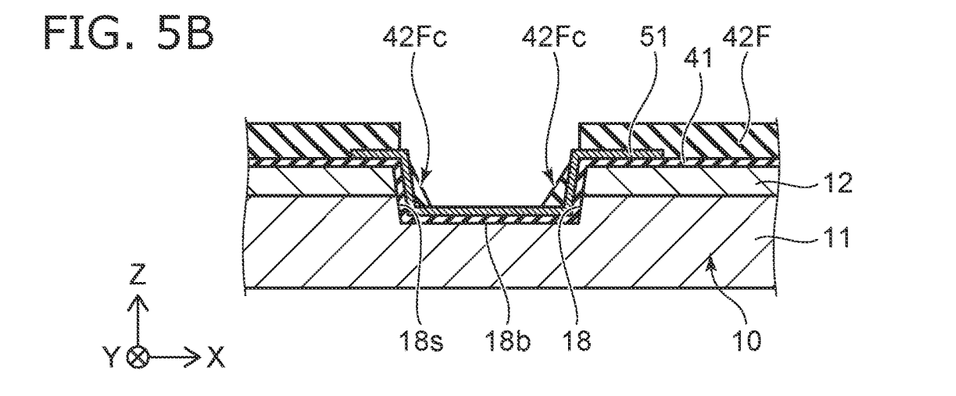

As shown in FIG. 5B, the mask material 47 is used as a mask to remove a portion of the insulating film 42F. For removal, for example, dry etching is used. As a result, the bottom insulating portion 42Fb is removed while leaving the corner insulating portion 42Fc.

Figure 5C:
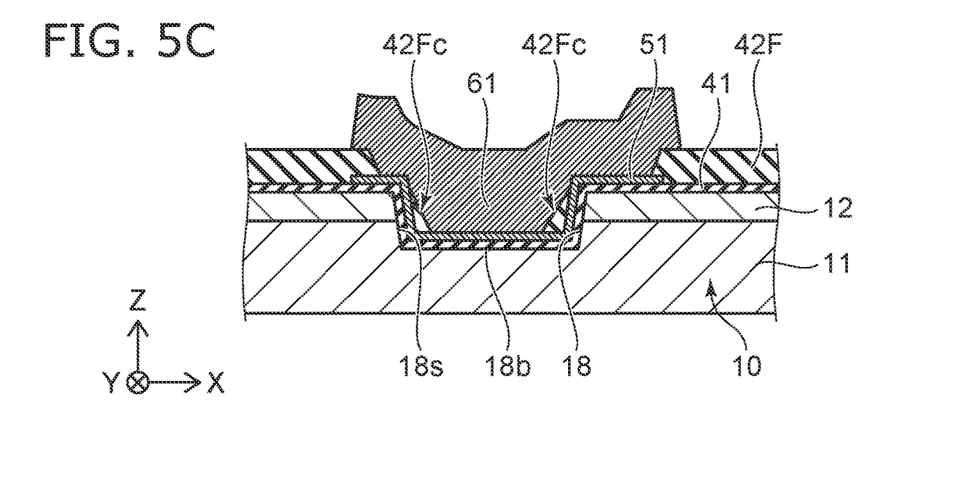

As shown in FIG. 5C, the first conductive member 61 is formed on the first electrode 51 and on the corner insulating portion 42Fc. The second electrode 52 and the third electrode 53 are appropriately formed.

According to the manufacturing method according to the embodiment, it is possible to provide a method for manufacturing a semiconductor device in which stable characteristics.

According to the embodiment, it is possible to provide a semiconductor device in which stable characteristics are obtained and a method for manufacturing the same.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor members, electrodes, conductive members, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a semiconductor member including a first partial region, a second partial region, and a third partial region, a position of the first partial region in a first direction from the second partial region toward the third partial region being between a position of the second partial region in the first direction and a position of the third partial region in the first direction;

a first conductive member including a first conductive portion, the first conductive portion being between the second partial region and the third partial region in the first direction, a direction from the first partial region toward the first conductive portion being along a second direction crossing the first direction;

a first electrode electrically connected to the first conductive member, the first electrode including a first electrode portion, a second electrode portion, and a third electrode portion, the first electrode portion being between the first partial region and the first conductive portion in the second direction, the second electrode portion being between the second partial region and the first conductive portion in the first direction, the third electrode portion being between the first conductive portion and the third partial region in the first direction;

a first insulating member, the first insulating member including a first insulating region, a second insulating region, and a third insulating region, the first insulating region being between the first partial region and the first electrode portion in the second direction, the second insulating region being between the second partial region and the second electrode portion in the first direction, the third insulating region being between the third electrode portion and the third partial region in the first direction; and a second insulating member, the second insulating member including a first insulating portion and a second insulating portion, the first insulating portion being between the second electrode portion and the first conductive portion in the first direction, the second insulating portion being between the first conductive portion and the third electrode portion in the first direction.

2. The device according to according to claim 1, wherein the first conductive member further includes a second conductive portion and a third conductive portion, the first insulating portion is between a portion of the first electrode portion and at least a portion of the second conductive portion in the second direction, and the second insulating portion is between an other portion of the first electrode portion and at least a portion of the third conductive portion in the second direction.

3. The device according to claim 2, wherein the second electrode portion is between the first partial region and the second conductive portion in the second direction, and the third conductive portion is between the first partial region and the third conductive portion in the second direction.

4. The device according to claim 2, wherein the second electrode portion is electrically connected to the second conductive portion, and the third electrode portion is electrically connected to the third conductive portion.

5. The device according to claim 2, wherein the second electrode portion is in contact with the second conductive portion, and the third electrode portion is in contact with the third conductive portion.

6. The device according to claim 1, wherein the first electrode portion is in contact with the first conductive portion.

7. The device according to claim 1, wherein the semiconductor member includes a first semiconductor region including $Al_{x1}Ga_{1-x1}N$ ($0 \leq x1 < 1$), and a second semiconductor region including $Al_{x2}Ga_{1-x2}N$ ($0 < x2 \leq 1$), the first semiconductor region includes a first portion, a second portion, and a third portion, the second semiconductor region includes a first semiconductor portion and a second semiconductor portion, the first portion is included in the first partial region, a direction from the second portion toward the first semiconductor portion is along the second direction, a direction from the third portion toward the second semiconductor portion is along the second direction, the second portion and the first semiconductor portion are included in the second partial region, and the third portion and the second semiconductor portion are included in the third partial region.

8. The device according to claim 7, further comprising:

a second electrode and a third electrode, a position of the first electrode in the first direction being between a position of the second electrode in the first direction and a position of the third electrode in the first direction, the first semiconductor portion being between at least a portion of the second electrode and the second insulating region in the first direction, and the second semiconductor portion being between the third insulating region and at least a portion of the third electrode in the first direction.

9. The device according to claim 8, wherein the second electrode is electrically connected to the second portion, and the third electrode is electrically connected to the third portion.

10. The device according to claim 7, wherein the second insulating member further includes a third insulating portion and a fourth insulating portion, the first semiconductor portion is between the second portion and the third insulating portion in the second direction, and the second semiconductor portion is between the third portion and the fourth insulating portion in the second direction.

11. The device according to claim 10, wherein the first electrode further includes a fourth electrode portion and a fifth electrode portion, at least a portion of the fourth electrode portion is between the firs semiconductor portion and the third insulating portion in the second direction, and at least a portion of the fifth electrode portion is between the second semiconductor portion and the fourth insulating portion in the second direction.

12. The device according to claim 11, further comprising:

a third insulating member, a portion of the third insulating member being between the first semiconductor portion and the fourth electrode portion in the second direction, and an other portion of the third insulating member being between the second semiconductor portion and the fifth electrode portion in the second direction.

13. The device according to claim 12, wherein the first insulating member includes silicon and oxygen, the second insulating member includes silicon and oxygen, the third insulating member includes silicon and nitrogen, and the first insulating member and the second insulating member do not include nitrogen, alternatively a concentration of nitrogen in the first insulating member and the second insulating member is lower than a concentration of nitrogen in the third insulating member.

14. The device according to claim 1, further comprising:
a nitride member including Al and nitrogen,
the nitride member including a first nitride portion, a second nitride portion, and a third nitride portion,
the first nitride portion being between the first partial region and the first insulating region,
the second nitride portion being between the second partial region and the second insulating region, and
the third nitride portion being between the third insulating region and the third partial region.

15. The device according to claim 1, wherein
the first electrode portion includes a first surface and a second surface,
the first surface faces the first conductive portion in the second direction,
the second surface faces the first insulating portion in the first direction,
the first insulating portion includes a third surface facing the first conductive portion in the first direction, and
a first angle between the third surface and the first surface is larger than a second angle between the second surface and the first surface.

16. The device according to claim 1, wherein
the first conductive portion includes a first corner portion,
the first corner portion faces the first electrode portion in the second direction, and faces the second partial region in the first direction, and
at least a portion of the first insulating portion is between the first corner portion and the second electrode portion.

17. The device according to claim 1, wherein
the first electrode includes titanium and nitrogen.

18. The device according to claim 17, wherein
the first conductive portion includes a first film and a second film,
the first film is between the first electrode portion and the second film, and
the first film includes a metal element included in the first electrode.

* * * * *